United States Patent [19]
Kim

[11] Patent Number: 5,110,708
[45] Date of Patent: May 5, 1992

[54] RADIATION-SENSITIVE MIXTURE AND PRODUCTION OF RELIEF IMAGES

[75] Inventor: Son N. Kim, Hemsbach, Fed. Rep. of Germany

[73] Assignee: BASF Aktiengesellschaft, Ludwigshafen, Fed. Rep. of Germany

[21] Appl. No.: 592,296

[22] Filed: Oct. 3, 1990

[30] Foreign Application Priority Data

Oct. 17, 1989 [DE] Fed. Rep. of Germany ....... 3935875

[51] Int. Cl.$^5$ .................................................. G03C 1/72
[52] U.S. Cl. ...................................... 430/270; 430/176
[58] Field of Search .................... 430/270, 192, 176

[56] References Cited

U.S. PATENT DOCUMENTS

| | | | |
|---|---|---|---|
| 3,915,706 | 10/1975 | Limburg et al. | 96/27 R |
| 4,491,628 | 1/1985 | Ito et al. | 430/176 |
| 4,678,737 | 7/1987 | Schneller et al. | 430/270 |
| 4,689,288 | 8/1987 | Buiguez et al. | 430/270 |
| 4,770,977 | 9/1988 | Buiguez et al. | 430/323 |
| 4,883,740 | 11/1989 | Schwalm et al. | 430/270 |
| 4,889,789 | 12/1989 | Stahlhofen | 430/270 |
| 4,980,263 | 12/1990 | Sekiya | 430/176 |

OTHER PUBLICATIONS

Applications of Photoinitiated Cationic Polymerization . . . Crivello, Polymer Sci., 48, p. 65-69.
Polymeric Material Science and Engineering, A.C.S., vol. 61, pp. 417-421 (1989).
Journal Polym. Sci., Pat A, Polym. Chem. Ed., vol. 24, pp. 2971-2980 (1986).
Pampalone "Solid State Technology" Jun. 1984, 114-129 (Novolak Resins Used in Positive Resist System).

Primary Examiner—Marion E. McCamish
Assistant Examiner—Christopher D. Rodee
Attorney, Agent, or Firm—Keil & Weinkauf

[57] ABSTRACT

A radiation-sensitive mixture, essentially consisting of
a) a binder or binder mixture which is insoluble in water but soluble in aqueous alkaline solutions,
b) a compound which forms a strong acid on exposure to radiation and
c) an organic compound which contains an acid-cleavable carbamate unit, is suitable for the production of relief structures.

9 Claims, No Drawings

RADIATION-SENSITIVE MIXTURE AND PRODUCTION OF RELIEF IMAGES

The present invention relates to positive-working radiation-sensitive mixtures which contain a binder which is insoluble in water but soluble in aqueous alkaline solutions, a compound which forms an acid on exposure to radiation and carbamate groups, and a process for the production of relief images. The novel mixtures are sensitive to UV radiation, electron beams and X-rays and are particularly suitable as resist material.

Positive-working radiation-sensitive mixtures are known. Positive-working resist materials which contain o-quinonediazides in binders, for example novolaks or poly-(p-vinylphenols), which are soluble in aqueous alkaline media are used commercially. However, the sensitivity of these systems to radiation, in particular short-wavelength radiation, is unsatisfactory in some cases.

Increases in sensitivity in radiation-sensitive systems which, in the primary photoreaction, produce a species which then initiates a catalytic secondary reaction independently of the radiation have likewise been described. Thus, U.S. Pat. No. 3,915,706 describes, for example, photoinitiators which produce a strong acid which then cleaves acid-labile groups, such as polyaldehyde groups, in a secondary reaction.

Radiation-sensitive mixtures which are based on acid-cleavable compounds and contain, as a binder, a polymer which is soluble in aqueous alkaline media, and a compound which forms a strong acid in a photochemical reaction and a further compound having acid-cleavable bonds, which increase their solubility in an alkaline developer as a result of the action of the acid, are also known (cf. DE-A-3 406 927). Compounds which form a strong acid in a photochemical reaction are diazonium, phosphonium, sulfonium, iodonium and halogen compounds. The use of these onium salts as photochemical acid donors in resist materials is also disclosed in, for example, U.S. Pat. No. 4,491,628. Crivello or Org. Coatings and Appl. Polym. Sci. 48 (1985), 65–69 gives an overview of the use of onium salts in resist materials.

Radiation-sensitive mixtures of polymers having acid-labile side groups and photochemical acid donors are disclosed in, for example, U.S. Pat. No. 4,491,628, FR-A-2 570 844 and Polymeric Material Science and Engineering, A.C.S., 61 (1989), 417–421. However, these polymeric binders are hydrophobic and become alkali-soluble only after exposure.

Copolymers having phenolic and acid-labile groups, for example poly-(p-hydroxystyrene-co-tertbutoxycarbonyloxystyrene) are disclosed in J. Polym. Sci., Part A, Polym. Chem. Ed. 24 (1986), 2971–1980. However, if copolymers of this group which are also alkali-soluble are used in conjunction with commercial sulfonium salts, such as triphenylphosphonium hexafluoroarsenate, as also described in U.S. Pat. No. 4,491,628, these mixtures have the disadvantage that a very large amount of material is removed from the unexposed parts, since these sulfonium salts do not contribute sufficiently toward inhibition of solubility.

DE-A-37 21 741 describes radiation-sensitive mixtures which contain a polymeric binder soluble in aqueous alkaline solutions and an organic compound whose solubility in an aqueous alkaline developer is increased by the action of an acid and which contains one or more acid-cleavable groups, this organic compound producing a strong acid on exposure to radiation.

It is an object of the present invention to provide novel positive-working highly active radiation-sensitive systems for the production of relief structures, which systems can be developed with aqueous alkaline solutions and permit the production of layers which are sensitive to short-wavelength UV light.

We have found that this object is achieved and that, surprisingly, high active radiation-sensitive systems for the production of relief structures in short-wavelength UV light can be produced by produced by incorporating carbamate groups, the said systems exhibiting very good reproducibility and high resolution.

The present invention relates to a radiation-sensitive mixture, essentially consisting of
(a) a binder or binder mixture which is insoluble in water but soluble in aqueous alkaline solutions and
(b) a compound which forms a strong acid on exposure to radiation,
wherein the mixture additionally contains an organic compound (c) which has an acid-cleavable carbamate unit

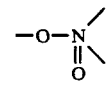

or component (a) or component (b) contains an acid-cleavable carbamate unit

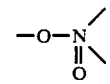

Examples of suitable binders (a) are phenolic resins, in particular novolaks having a mean molecular weight $\overline{M}_w$ of from 300 to 30,000, and preferably poly-(p-hydroxystyrene), poly-(p-hydroxy-α-methylstryene) or copolymers of p-hydroxystyrene whose mean molecular weights $\overline{M}_w$ are from 200 to 200,000.

In particular, sulfonium salts of the general formula (I)

where $R^1$, $R^2$ and $R^3$ are identical or different and are each alkyl of 1 to 3 carbon atoms, aryl, substituted aryl or aralkyl and $X^\ominus$ is $ClO_4^\ominus$, $AsF_6^\ominus$, $SbF_6^\ominus$, $PF_6^\ominus$, $BF_4^\ominus$ and/or $CF_3SO_3^\ominus$ are used as compounds (b) which form a strong acid on exposure to radiation; preferred sulfonium salts of the general formula (I) are those in which one or more of the radicals $R^1$, $R^2$ and $R^3$ are a radical

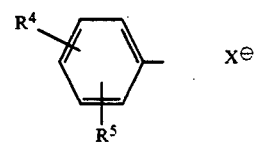

where $R^4$ and $R^5$ are identical or different and are each H, OH or a radical

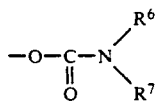

where $R^6$ and $R^7$ are identical or different and are each H or alkyl of 1 to 5 carbon atoms, or $R^6$ is bonded to $R^7$ to form a five-membered or six-membered, unsubstituted or monosubstituted or polysubstituted, heterocyclic ring.

The novel radiation-sensitive mixtures contain the compound (b) which forms a strong acid on exposure to radiation in general in an amount of from 1 to 30% by weight based on the total amount of the substances (a)+(b).

Preferably used additional organic compounds (c) which have an acid-cleavable carbamate unit

are compounds of the general formula (II)

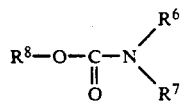

where $R^6$ and $R^7$ are identical or different and are each H or alkyl of 1 to 5 carbon atoms, or $R^6$ is bonded to $R^7$ to from a five-membered or six-membered, unsubstituted or monosubstituted or polysubstituted, heterocyclic ring, and $R^8$ is straight-chain or branched alkyl of 1 to 10 carbon atoms, halogen-containing straight-chain or branched alkyl of 1 to 10 carbon atoms, phenyl, alkyl, alkoxy or halophenyl, or phenylalkyl where the alkyl group is of 1 to 3 carbon atoms, halo- or alkoxyphenylalkyl where the alkyl groups are of 1 to 3 carbon atoms or a methyl or ethyl radical which is substituted by a heterocyclic radical.

The novel mixtures may additionally contain, as a sensitizer, a polycyclic aromatic compound which absorbs radiation and transfers it to the compound (b) which forms a strong acid on exposure to radiation.

The present invention furthermore relates to a process for the production of relief structure or relief images by application of a photoresist solution in a layer thickness of from 0.1 to 5 μm to a substrate pretreated in a conventional manner, drying, imagewise exposure, heating to 50°–150° C. and development with an aqueous alkaline solution, wherein the photoresist solution used contains a novel radiation-sensitive mixture.

Regarding the components of the novel radiation-sensitive mixture, the following may furthermore be stated specifically.

(a) Because of the desired stability to plasma etching, a particular phenolic resins, for example novolaks, as described in, for example, Novolak Resins used in Positive Resist Systems (T. Pampalone in Solid State Technology, June 1984, pages 115–120), are used as binders (a) which are insoluble in water but soluble or dispersible in aqueous alkaline solutions, novolaks based on p-cresol/formaldehyde being preferred for exposure in the short-wavelength UV range ($\lambda \leq 300$ nm). Poly-(p-hydroxystyrenes), poly-(p-hydroxy-α-methylstyrenes) and copolymers of p-hydroxystyrene are particularly preferred.

If carbamate groups are present in the binder (a), they may be represented by the following formula

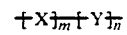

where
$m \geq n$,
X is a phenolic monomer unit, e.g. p-hydroxystryene or p-hydroxy-α-methylstyrene, and
Y is a monomer unit having a

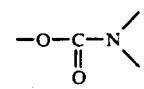

group for example N-alkoxycarbonylmaleimide of the formula

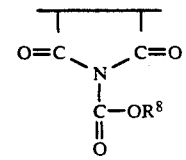

or carbamate-modified p-hydroxystyrene units of the formulae

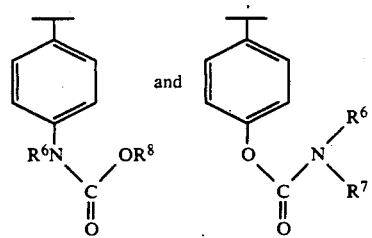

where $R^6$, $R^7$ and $R^8$ may have the abovementioned meanings.

Component (a) is present in the novel radiation-sensitive mixture in general in amounts of from 70 to 99, preferably from 75 to 95, % by weight, based on the total amount of the mixture of (a)+(b)+(c).

(b) In principle, all compounds which form a strong acid on exposure to radiation can be used as the acid donor. However, sulfonium salts of the general formula (I)

where $R^1$, $R^2$ and $R^3$ are identical or different and are each alkyl of 1 to 3 carbon atoms, e.g. methyl or ethyl, aryl, e.g. phenyl, or aralkyl, e.g. benzyl, and $X^{\ominus}$ may be the anions $ClO_4^{\ominus}$, $AsF_6^{\ominus}$, $SbF_6^{\ominus}$, $PF_6^{\ominus}$, $BF_4^{\ominus}$ and/or $CF_3SO_3^{\ominus}$, are preferred for exposure to short-wavelength UV radiation.

Particularly preferred sulfonium salts are those of the general formula (I) in which one or more of the radicals $R^1$, $R^2$ and $R^3$ are a radical

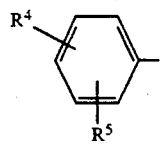

where $R^4$ and $R^5$ are identical or different and are each H, OH or a radical

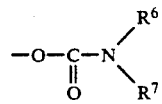

where $R^6$ and $R^7$ are identical or different and are each hydrogen, straight-chain alkyl of 1 to 10, preferably 1 to 5, carbon atoms, e.g. methyl or ethyl, branched alkyl of 3 to 10, preferably 3 to 5, carbon atoms, in which the alkyl groups may furthermore be substituted by halogen, e.g. chlorine or bromine, preferably chlorine, OH, SH, alkoxy of 1 to 4 carbon atoms, e.g. methoxy or ethoxy, O-aryl, O-aralkyl, alkylthio of 1 to 4 carbon atoms, S-aryl, such as S-phenyl, or S-aralkyl, such as S-benzyl, aryl, e.g. phenyl, halogen-substituted aryl, e.g. chlorophenyl or bromophenyl, alkyl-substituted aryl, e.g. tolyl, alkoxy-substituted aryl, e.g. methoxyphenyl, or aralkyl, e.g. benzyl or phenylethyl, or $R^6$ is bonded to $R^7$ to form a nitrogen-containing heterocyclic radical having 5 to 8, preferably 5 or 6, ring members, resulting, with the inclusion of the amide nitrogen of the carbamate group, in, for example, rings such as

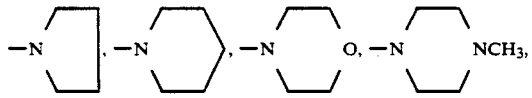

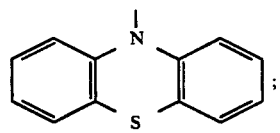

$R^6$ and/or $R^7$ may furthermore be acyl, resulting, with inclusion of the N of the carbamate group, in, for example, the following radicals:

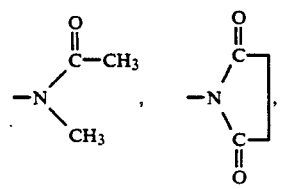

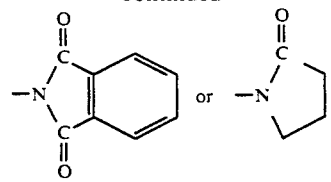

Examples of suitable counter-ions $X^\ominus$ are $ClO_4^\ominus$, $AsF_6^\ominus$, $SbF_6^\ominus$, $CF_3SO_3^\ominus$ (=triflate), $PF_6^\ominus$ and $BF_4^\ominus$.

Preferred sulfonium salts are, in particular, triphenylsulfonium hexafluoroarsenate, dimethyl-4-hydroxyphenylsulfonium triflate and dimethyl-4-hydroxy-3,5-dimethylphenylsulfonium hexafluoroarsenate.

Examples of further acid donors (b) are iodonium salts of the general formula

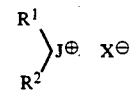

where $R^1$, $R^2$ and $X^\ominus$ have the same meanings as in the general formula (I).

The compounds which form a strong acid on exposure to radiation, among which the abovementioned sulfonium salts are preferred, are present in the novel radiation-sensitive mixture in general in an amount of from 1 to 30, preferably from 3 to 10, % by weight, based on the total amount of (a)+(b)+(c).

(c) Suitable organic compounds (c) are those which contain one or more acid-cleavable carbamate units

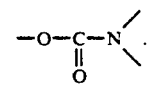

Compounds of the general formula (II)

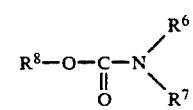

where $R^6$ and $R^7$ are identical or different and are each hydrogen, straight-chain alkyl of 1 to 10, preferably 1 to 5, carbon atoms, e.g. methyl, ethyl, propyl, n-butyl or n-pentyl, branched alkyl of 3 to 10, preferably 3 to 5, carbon atoms, e.g. isopropyl or isobutyl, a corresponding alkyl radicals which is substituted by halogen, such as chlorine or bromine, OH, SH, alkoxy or thioalkyl of 1 to 5 carbon atoms, aryl, e.g. phenyl, aralkyl, e.g. benzyl or phenylethyl, an aryl or aralkyl radical which is monosubstituted or polysubstituted by alkyl, alkoxy or halogen, e.g. tolyl, methoxyphenyl, 4-methoxybenzyl or 4-chlorobenzyl, or $R^6$ and $R^7$ are bonded to one another to form a nitrogen-containing heterocyclic radical having 5 to 8, preferably 5 or 6, ring members, resulting, with inclusion of the amide nitrogen of the carbamate group in, for example, rings such as

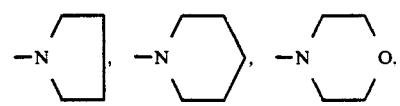

-continued

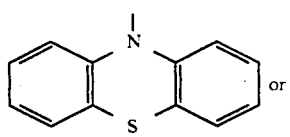

or

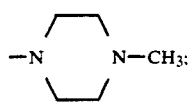

$R^6$ and $R^7$ may furthermore be acyl, resulting, with inclusion of the N of the carbamate group, in, for example, the radicals

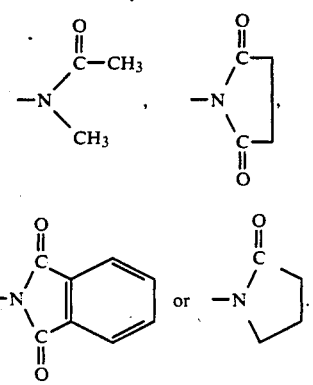

$R^6$ and $R^7$ may furthermore be a polymer chain, for example the units

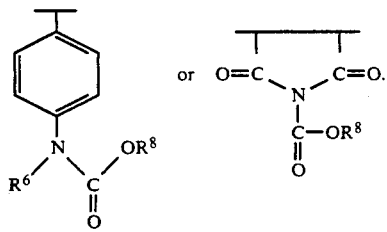

$R^8$ may be straight-chain alkyl of 1 to 10, preferably 1 to 5, carbon atoms, e.g. methyl, ethyl, propyl, n-butyl or n-pentyl, branched alkyl of 3 to 10, preferably 3 to 5, carbon atoms, e.g. isopropyl or isobutyl, tertiary alkyl of 4 to 10 carbon atoms, e.g. tert-butyl, where the abovementioned alkyl radicals may furthermore be halogen-substituted, i.e. monosubstituted or polysubstituted by halogen, such as chlorine or bromine, preferably chlorine, e.g. b-chloroethyl, b-bromoethyl, b-trichloroethyl, b-chloroisopropyl or b-trichloroisopropyl, aryl, such as phenyl or biphenyl, halogen-substituted aryl, e.g. chlorophenyl, aralkyl, such as benzyl or phenyl-ethyl or halogen-substituted aralkyl, for example benzyl which is halogen-substituted, for example chlorine-substituted, or alkoxy-substituted in the benzene ring.

The amount of component (c) present in the novel radiation-sensitive mixture depends on whether, and how many, carbamate groups are present in components (a) and/or (b). Where neither component (a) nor component (b) contains carbamate groups, the amount of component (c) in the novel radiation-sensitive mixture is from 5 to 40, preferably from 15 to 30, % by weight, based on the total amount of components (a)+(b)+(c).

The carbamate group

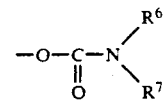

can be obtained by one of the methods stated below:

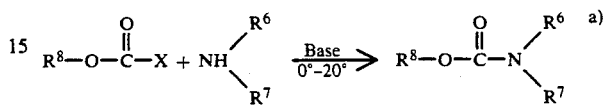

where —X is —Cl, —$N_3$, —$OR^8$ or O—C—$OR^8$
                                        ‖
                                        O

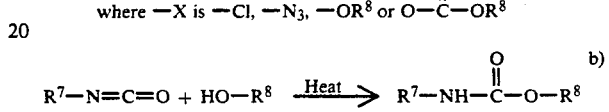

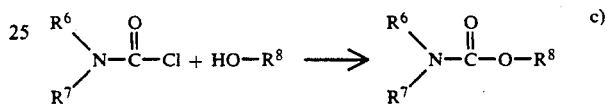

The novel mixtures are preferably dissolved in an organic solvent, the solids content generally being from 5 to 40% by weight. Preferred solvents are aliphatic ketones, ethers and mixtures thereof, in particular ethylcellosolve, butylglycol, methylcellosolve and 1-methoxy-2-propanol, alkylene glycol alkyl ether esters, for example methylcellosolve acetate, ethylcellosolve acetate, methylpropylene glycol acetate and ethylpropylene glycol acetate, ketones, for example cyclohexanone, cyclopentanone and methyl ethyl ketone, and acetates, such as butyl acetate, and aromatics, such as toluene and xylene. The choice of the corresponding solvents and mixtures thereof depends on the choice of the particular phenolic polymer, novolak and photosensitive component.

Other additives, such as adhesion promoters, wetting agents, dyes and plasticizers, may also be added.

Small amounts of sensitizers may, if required, also be added in order to sensitize the compounds in the relatively long-wavelength UV range to the visible range. Polycyclic aromatics, such as pyrene and perylene, are preferred for this purpose, but other dyes which act as sensitizers may also be used.

The solution of the radiation-sensitive mixture can be filtered through a filter having a pore diameter of 0.2 μm. By applying the resist solution by spin coating at speeds of from 1,000 to 10,000 rpm, a resist film having a layer thickness of from 0.1 to 5 μm is produced on a wafer (for example a silicon wafer oxidized on the surface). The wafer is heated at from 1 to 5 minutes at 90° C. or 80° C.

In the novel process for the production of relief images, a radiation-sensitive recording layer, which essentially consists of the novel radiation-sensitive mixture, is exposed imagewise to a dose such that the solubility of the exposed parts in aqueous alkaline solvents increases after heating at from 60° to 120° C., and these parts can be removed selectively with the alkaline developer.

The resist films are generally exposed to UV light from a mercury lamp, to excimer laser light, electron beams or X-rays through a chromium-plated structured quartz mask. The imagewise exposed films are heated for 5 seconds to 2 minutes at from 60° to 110° C. and then developed with aqueous alkaline developer, the exposed parts being selectively detached while little removal of material takes place in the unexposed parts.

In the Examples which follow, parts and percentages are by weight, unless otherwise stated.

EXAMPLE 1

A photoresist solution is prepared from 80 parts of poly(p-hydroxystyrene) (commercial product from Polysciences, $\overline{M}_w$=from 1500 to 7000 g/mol), 5 parts by triphenylsulfonium hexafluoroarsenate (commercial product from Alfa), 15 parts of N-ethoxycarbonylmorpholine and 280 parts of methylglycol acetate. The solution is then filtered through a filter having a pore diameter of 0.2 μm.

The resist solution is applied by spin coating to an oxidized silicon wafer in a layer thickness of 1 μm. The wafer is dried for one minute at 90° C. and then exposed for 7 seconds to excimer laser light of wavelength λ=248 nm using a test mask by the contact process. Thereafter, heating is carried out for 30 seconds at 90° C. and development is effected with a developer of pH from 12.0 to 13.5 for about 20 seconds.

EXAMPLE 2

A photoresist solution is prepared from 80 parts of poly(p-hydroxystyrene), 5 parts of triphenylsulfonium hexafluoroarsenate, 15 parts of N-2-trichloroethoxycarbonylpyrrolidone and 280 parts of methylglycol acetate. The procedure described in Example 1 is followed. The sensitivity for 1 μm layer thickness is 175 mJ/cm².

EXAMPLE 3

A photoresist solution is prepared from 80 parts of poly(p-hydroxystyrene), 5 parts of triphenylsulfonium hexafluoroarsenate, 15 parts of tert-butyl N,N-diethylcarbamate and 280 parts of methylglycol acetate. The procedure described in Example 1 is followed. The sensitivity for 1 μm layer thickness is 80 mJ/cm².

EXAMPLE 4

A photoresist solution is prepared from 95 parts of poly(p-hydroxystyrene-co-20 mol % N-chloroethoxycarbonylmaleimide), 5 parts of triphenylsulfonium hexafluoroarsenate and 300 parts of ethylglycol acetate. The procedure described in Example 1 is followed. The sensitivity for 1 μm layer thickness is 150 mJ/cm².

We claim:

1. A radiation-sensitive mixture, consisting essentially of
   (a) a binder or binder mixture which is insoluble in water but soluble in aqueous alkaline solutions and
   (b) a compound which forms a strong acid on exposure to radiation,
wherein the mixture additionally contains an organic compound (c) which has an acid-cleavable carbamate unit

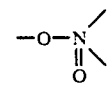

or component (a) contains an acid-cleavable carbamate unit

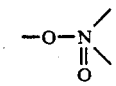

2. A radiation-sensitive mixture as claimed in claim 1, wherein the binder (a) used is a phenolic resin.

3. A radiation-sensitive mixture as claimed in claim 2, wherein the phenolic resin used is a novolak having a mean molecular weight $\overline{M}_w$ of from 300 to 30,000.

4. A radiation-sensitive mixture as claimed in claim 1, wherein the binder (a) used is poly-(p-hydroxystryene), poly-(p-hydroxy-α-methylstyrene) or a copolymer of p-hydroxystryene, the mean molecular weight $\overline{M}_w$ of the binder (a) being from 200 to 200,000.

5. A radiation-sensitive mixture as claimed in claim 1, wherein a sulfonium salt of the formula (I)

where $R^1$, $R^2$ and $R^3$ are identical or different and are each alkyl of 1 to 3 carbon atoms, aryl, substituted aryl or aralkyl and $X^\ominus$ is $ClO_4^\ominus$, $AsF_6^\ominus$, $SbF_6^\ominus$, $PF_6^\ominus$, $BF_4^\ominus$ and/or $CF_3SO_3^\ominus$, is used as the compound (b) which forms a strong acid on exposure to radiation.

6. A radiation-sensitive mixture as claimed in claim 5, wherein, in the sulfonium salt of the formula (I), one or more of the radicals $R^1$, $R^2$ and $R^3$ are a radical

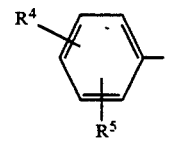

where $R^4$ and $R^5$ are identical or different and are each H, OH or a radical

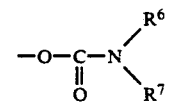

where $R^6$ and $R^7$ are identical or different and are each H or alkyl of 1 to 5 carbon atoms, or $R^6$ is bonded to $R^7$ to form a five-membered or six-membered, unsubstituted or monosubstituted or polysubstituted, heterocyclic ring.

7. A radiation-sensitive mixture as claimed in claim 1, wherein the compound (b) which forms a strong acid on exposure to radiation is present in the radiation-sensitive mixture in an amount of from 1 to 30% by weight, based on the total amount of the substances (a)+(b).

8. A radiation-sensitive mixture as claimed in claim 1, wherein a compound of the formula (II)

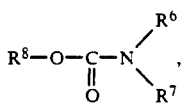 (II)

where $R^6$ and $R^7$ are identical or difference and are each H or alkyl of 1 to 5 carbon atoms, or $R^6$ is bonded to $R^7$ to form a five-membered or six-membered, unsubstituted or monosubstituted or polysubstituted, heterocyclic ring, $R^8$ is straight-chain or branched alkyl of 1 to 10 carbon atoms, halogen-containing straight-chain or branched alkyl of 1 to 10 carbon atoms, phenyl, halo-, alkyl- or alkoxyphenyl, phenalkyl where alkyl is of 1 to 3 carbon atoms, halo- or alkoxyphenalkyl where alkyl is of 1 to 3 carbon atoms, or a methyl or ethyl radical which is substituted by a heterocyclic radical, is used as the additional organic compound (c) which has an acid-cleavable carbamate unit.

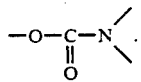

9. A radiation-sensitive mixture as claimed in claim 1, which additionally contains, as a sensitizer, a polycyclic aromatic compound which absorbs radiation and transfers it to the compound (b) which forms a strong acid on exposure to radiation.

* * * * *

UNITED STATES PATENT AND TRADEMARK OFFICE
CERTIFICATE OF CORRECTION

PATENT NO. : 5,110,708
DATED : May 5, 1992
INVENTOR(S) : Son Nguyen KIM

It is certified that error appears in the above-identified patent and that said Letters Patent is hereby corrected as shown below:

On the title page; Item [30]

Foreign Application Priority Date
should read --Oct. 27, 1989--

Col. 2, Line 26-28

That part reading $-O-N$ should read $-O-\underset{\underset{O}{\|}}{C}-N$
$\phantom{That part reading -O-}\underset{O}{\|}$ The same error appears in Col. 2, line 35 & 37 Col. 3, line 23-25 in Claims
Cl. 1, Col. 10, Lines 3-5

That part reading "$-O-N$" should read $-O-\underset{O}{C}-N$
$\phantom{That part reading "-}\underset{O}{}$

UNITED STATES PATENT AND TRADEMARK OFFICE
CERTIFICATE OF CORRECTION

PATENT NO. : 5,110,708
DATED : May 5, 1992
INVENTOR(S) : Son Nguyen Kim

It is certified that error appears in the above-indentified patent and that said Letters Patent is hereby corrected as shown below:

Col.10, lines 11-13, Claim 1, Same error as above

Col. 11, line 9, Claim 8, Delete "difference" and insert -- different --.

Signed and Sealed this

Thirteenth Day of July, 1993

Attest:

MICHAEL K. KIRK

Attesting Officer     Acting Commissioner of Patents and Trademarks